United States Patent
Yang et al.

(10) Patent No.: US 6,192,497 B1
(45) Date of Patent: Feb. 20, 2001

(54) PARALLEL CHIEN SEARCH CIRCUIT

(75) Inventors: Honda Yang, Santa Clara; John T. Gill, III, Stanford, both of CA (US)

(73) Assignee: Adaptec, Inc., Milpitas, CA (US)

( * ) Notice: Under 35 U.S.C. 154(b), the term of this patent shall be extended for 0 days.

(21) Appl. No.: 09/141,871

(22) Filed: Aug. 27, 1998

(51) Int. Cl.$^7$ .................................................. H03M 13/03
(52) U.S. Cl. .............................................................. 714/781
(58) Field of Search ................................. 714/781, 782, 714/784, 785; 708/492

(56) References Cited

U.S. PATENT DOCUMENTS

| | | | |
|---|---|---|---|
| 4,845,713 | * 7/1989 | Zook | 714/784 |
| 5,414,719 | * 5/1995 | Iwaki et al. | 714/785 |
| 5,701,314 | 12/1997 | Armstrong et al. | 714/65 |
| 5,719,884 | 2/1998 | Roth et al. | 714/755 |
| 5,805,617 | 9/1998 | Im | 714/785 |
| 5,912,905 | * 6/1999 | Sakai et al. | 714/784 |
| 5,951,677 | * 9/1999 | Wolf et al. | 712/228 |
| 5,974,582 | * 10/1999 | Ly | 714/781 |

OTHER PUBLICATIONS

S. Lin and D. Costello, Jr., "Error Control Coding", Published Oct. 1982, © 1983, Prentice–Hall, Inc. Englewood Cliffs, NJ, pp. 167–174.
S. Wilson, "Digital Modulation and Coding", 1996, Ch. 5, pp. 470–472, Prentice–Hall, NJ.
N. Glover and T. Dudley, "Practical Error Correction Design for Engineers", 1991, Cirrus Logic, Inc., CO, Rev. 2$^{nd}$ Ed.
W.W. Peterson and E.J. Weldon, Jr., "Error–Correcting Codes", 1972, (12$^{th}$ printing 1994), Mass, Inst. Of Technology, pp. 131–136.
S.B. Wicker, "Error Control Systems for Digital Communication and Storage", Ch. 9, "The Decoding of BCH and Reed–Solomon Codes", pp. 203–234, 1995 Prentice Hall, NJ.

* cited by examiner

Primary Examiner—Albert De Cady
Assistant Examiner—Shelly A Chase
(74) Attorney, Agent, or Firm—Martine Penilla & Kim, LLP

(57) ABSTRACT

Disclosed is a Chien search circuit for determining roots to an error locator polynomial that is defined by a set of coefficients. The circuit includes N sub-Chien search circuits, each of which is configured to sequentially evaluate a subset of field elements from a specified set of field elements. Each sub-Chien search circuit includes a set of storage elements, a set of constant multipliers, an adder, and a comparator. The set of storage elements stores a set of values, and receives and stores the set of coefficients as the set of values. One storage element is associated with each coefficient. The set of constant multipliers is coupled to receive the set of values from the set of storage elements. One constant multiplier is associated with one storage element. Each of the constant multipliers is associated with a constant field element and is configured to multiply the received value and the constant field element to generate a product. Each of the constant multipliers is coupled to feed the product back to the associated storage element for storage. The adder is coupled to receive the stored set of values from the set of storage elements for generating a sum of the set of values for a current field element being evaluated. The comparator is coupled to receive the sum for comparing the sum to a specified constant value. The comparator generates a signal indicating that the current field element is a root when the sum is equal to the specified constant value.

45 Claims, 8 Drawing Sheets

PARALLEL CHIEN SEARCH CIRCUIT

BACKGROUND OF THE INVENTION

1. Field of the Invention

This invention relates generally to hard disk error correction code decoders, and more particularly to devices and methods for solving error locator polynomials.

2. Description of the Related Art

Modern computer systems generally include one or more hard disk drives to store large amount of data and programs. Hard disk drives typically store information in sequence by using magnetic technology. Like most recording technology, reading the sequential data bits from a hard disk often generates errors due to noise, manufacturing imperfections of the physical medium, dust, etc.

To detect and correct such errors, hard disk drives typically implement an error correction code (ECC) scheme in writing to and reading from hard disk drives. These hard disk drives generally include ECC circuitry that implement ECC schemes using well known codes such as Reed-Solomon codes to encode user data for reliable recovery of the original data through an ECC decoder. This helps to achieve a higher areal density.

Conventional ECC schemes compute ECC bytes for a given block of user data such as a data sector. The computed ECC bytes are appended to the block of user data sector and then recorded on a hard disk. When the entire sector is read, the ECC approach computes error locations and error patterns in the user data by decoding the ECC bytes.

Prior Art FIG. 1 illustrates a block diagram of a conventional computer system 100 including a host computer 118 that receives data from a disk 102 in a hard disk drive. A motor 104 spins the disk 102 containing the data. A read/write head 106 attached to an actuator 108 searches for a track and sectors that contain the desired data. Upon finding the desired sectors, the read/write head 106 reads the data sequentially from the disk 102. An amplifier 110 amplifies the data signals and transmits the amplified data signals to an analog-to-digital converter 112.

The analog-to-digital converter 112 converts the amplified data signals into digital data bits and transmits the data bits to a deserializer 114. The deserializer 114 receives the sequential data bits and converts the data into a series of blocks called sectors, each of which is typically 512 bytes of user data and ECC bytes appended to the user data bytes. The deserializer 114 sequentially transmits the sectors to an error detection and correction (EDAC) circuitry 116, which detects errors in the received sector and, if correctable, corrects the detected errors using an ECC scheme. The EDAC circuitry 116 then transmits the error corrected user data to the host computer 118.

The EDAC circuitry 116 typically employs a conventional Reed-Solomon code in its ECC scheme to encode user data for reliable recovery of the original data. Under the Reed-Solomon code ECC scheme, assuming $\Lambda(z)$ is an error locator polynomial that has its roots the inverses of the $v$ error locators $\{\alpha^{i_k}\}$, then the error locator polynomial $\Lambda(z)$ can be expressed as:

$$\Lambda(z) = \prod_{l=1}^{v} (1 - Z\alpha^{j_l}) = \Lambda_v z^v + \Lambda_{v-1} z^{v-1} + \ldots + \Lambda_1 z + \Lambda_0 \quad (2)$$

Equation (2) can be used to evaluate the error locator polynomial $\Lambda(z)$ at all nonzero field elements, $\alpha^0$ to $\alpha^{2^b-2}$ in a finite field, where b is the number of bits in a symbol (e.g., byte). For example, for a byte containing 8 bits, the field $GF(2^8)$ includes 255 field elements from $\alpha^0$ to $\alpha^{254}$. The error locator polynomials and Galois fields are well known in the art and is described, for example, in Error Control Systems for Digital Communication and Storage, by Stephen B. Wicker, 1995, ISBN 0-13-200809-2, which is incorporated herein by reference.

Prior Art FIG. 2 shows a more detailed block diagram of the EDAC circuitry 116 that utilizes the ECC scheme. The EDAC circuitry 116 receives a sector 200 of user data bytes of 512 bytes and additional ECC bytes in a sequential manner. At the front end of the EDAC circuitry 116, a syndrome generator 202 receives the sector 200 and generates partial syndromes from the received sector data. Syndrome generators are well known in the art and are typically implemented as a linear feedback shift register circuit. The generated partial syndrome indicates whether an error is present in the received sector 200. For example, a zero syndrome indicates that no error has been detected. On the other hand, a nonzero syndrome indicates that one or more errors has been detected in the received data.

The generated partial syndromes are then transmitted to an ECC decoder 204, which includes error locator polynomial generator 206, an error locator polynomial solver 208, and an error pattern generator 210. The error locator polynomial generator 206 receives the partial syndromes from the syndrome generator 202 and generates a set of coefficients (i.e., $\Lambda_i$s) for the received sector 200. The generated set of coefficients defines an error locator polynomial. Using the coefficients defining the error locator polynomial, the error locator polynomial solver 208 sequentially computes the error locations (e.g., byte locations) in the received sector by determining the roots of the error locator polynomial and feeds the error locations to the error pattern generator 210. The error pattern generator 210 computes error patterns in the received sector 200 using the error locations and partial syndromes. The EDAC circuitry 116 then uses the error locations and error patterns to correct the errors in the received sector.

The error locator polynomial solver 208 is typically implemented by means of a conventional Chien search technique to determine error locations, $\alpha^i$s, from the coefficients of an error locator polynomial, $\Lambda(z)$. The Chien search technique is a systematic means of evaluating the error locator polynomial at all elements in a field $GF(2^m)$. Each coefficient $\Lambda_i$ of the error locator polynomial, for i greater than 0, is repeatedly multiplied by $\alpha^i$. Each set of the products is then summed and compared with 1. If the sum is equal to 1, then $\alpha^i$ is a root of the error locator polynomial, $\Lambda(z)$, and an error is indicated at the coordinate or location associated with $\alpha^{-i} = \alpha^{n-i}$, where the data bytes in a received sector are labeled $(r_0, r_1, \ldots, r_{n-1})$. Chien search techniques and circuits are well known in the art and are described, for example, in Error Control Systems for Digital Communication and Storage, Stephen B. Wicker, 1995, ISBN 0-13-200809-2, on pages 204–211, the disclosure of which is incorporated herein by reference.

Prior Art FIG. 3 illustrates a conventional Chien search circuit 208 for finding a set of error locations by evaluating an error locator polynomial at all elements from $\alpha^0$ to $\alpha^{254}$ sequentially in a field $GF(2^8)$. In particular, the Chien search circuit 208 determines the roots to the error locator polynomial defined by a set of coefficients including $\Lambda_1, \Lambda_2, \Lambda_3, \Lambda_4, \Lambda_5$, and $\Lambda_6$ ($\Lambda_1$ to $\Lambda_6$ hereinafter). The Chien search circuit 208 includes a set of storage elements 302, 304, 306, 308, 310, and 312 (302 to 312 hereinafter), which initially receive and store the set of coefficients, $\Lambda_1$ to $\Lambda_6$, respectively.

Each of the storage elements 302 through 312 is associated with a constant GF multiplier, which is well known in the art. Specifically, the storage elements 302 to 312 are coupled to constant multipliers 318, 320, 322, 324, 326, and 328 (318 to 328 hereinafter), respectively, in a feedback configuration. The constant multipliers 318 to 328, respectively, are operative to multiply constants $\alpha^1$, $\alpha^2$, $\alpha^3$, $\alpha^4$, $\alpha^5$, and $\alpha^6$, respectively, with the coefficients $\Lambda_1$, $\Lambda_2$, $\Lambda_3$, $\Lambda_4$, $\Lambda_5$, and $\Lambda_6$. The resulting products are then stored back in the associated storage elements 302 to 312 in a feedback configuration. Accordingly, each of the storage elements 302 to 312 provides a coefficient or a product to the associated constant multiplier, which then feeds the result back to the associated storage element for storage.

The Chien search circuit 208 also includes a conventional Galois Field (GF) adder 314 and a comparator 316. At each clock cycle, the Chien search circuit sequentially increments $\alpha^i$ from $\alpha^0$ to $\alpha^{254}$ by means of a counter. At the same time, the contents of the storage elements 302 through 312 are fed to the adder 314 to generate a sum. The sum is then fed to the comparator, which compares the sum to a constant value, 1. If the sum is equal to the constant value, the particular $\alpha^i$ in the counter is output as a root of the error locator polynomial. This process repeats for all the field elements sequentially from $\alpha^0$ to $\alpha^{254}$ to find the roots.

Unfortunately, the conventional Chien search circuit 208 is not very efficient in finding the roots of an error locator polynomial. Specifically, since the Chien search circuit 208 tests each of the 255 field elements sequentially, it requires 255 clock cycles to determine if each of the field elements is a root. Accordingly, the Chien search circuit 208 takes 255 clock cycles to find all the roots to the error locator polynomial.

Thus, what is needed is a circuit and a method that can determine the roots of an error locator polynomial in a more efficient and timely manner.

SUMMARY OF THE INVENTION

Broadly speaking, the present invention fills these needs by providing a circuit and method for efficiently determining roots of an error locator polynomial. It should be appreciated that the present invention can be implemented in numerous ways, including as a process, an apparatus, a system, a device, a method, or a computer readable medium. Several inventive embodiments of the present invention are described below.

In one embodiment, the present invention provides a Chien search circuit for determining roots of an error locator polynomial that is defined by a set of coefficients. The circuit includes N sub-Chien search circuits, each of which is configured to sequentially evaluate a subset of field elements from a specified set of field elements. Each sub-Chien search circuit includes a set of storage elements, a set of constant multipliers, an adder, and a comparator. The set of storage elements stores a set of values, and receives and stores the set of coefficients as the set of values. One storage element is associated with each coefficient. The set of constant multipliers is coupled to receive the set of values from the set of storage elements. One constant multiplier is associated with one storage element. Each of the constant multipliers is associated with a constant field element and is configured to multiply the received value and the constant field element to generate a product. Each of the constant multipliers is coupled to feed the product back to the associated storage element for storage. The adder is coupled to receive the stored set of values from the set of storage elements for generating a sum of the set of values for a current field element being evaluated. The comparator is coupled to receive the sum for comparing the sum to a specified constant value. The comparator generates a signal indicating that the current field element is a root when the sum is equal to the specified constant value.

In another embodiment, the present invention provides a method for determining roots to an error locator polynomial that is defined by a set of coefficients. The method includes: (a) storing the set of coefficients as a set of values; (b) partitioning a set of field elements into N subsets; and (c) for each of the N subsets of field elements, (i) generating a sum of the set of values for a current field element being evaluated; (ii) multiplying the set of values and a set of constant field elements to generate a set of products; (iii) storing the set of products as the set of values; (iv) comparing the sum to a specified constant value to generate a signal indicating that the current field element is a root when the sum is equal to the specified constant value; and (v) repeating operations i) through iv) until a specified number of roots have been found.

In yet another embodiment, a Chien search circuit for determining roots to an error locator polynomial is disclosed. The error locator polynomial is defined by a set of coefficients. The Chien search circuit includes N sub-Chien search circuits with each sub-Chien search circuit being configured to sequentially evaluate a subset of field elements from a specified set of field elements. Each of the sub-Chien search circuit includes storing means, multiplying means, adding means, and comparing means. The storing means stores a set of values. The storing means initially receives and stores the set of coefficients as the set of values. The multiplying means multiplies the set of values and a set of constant field elements to generate a set of products. The multiplying means is configured to feed the set of products back to the storing means for storage. The adding means receives the stored set of values to generate a sum of the values for a current field element being evaluated. The comparing means is configured to receive the sum for comparing the sum to a specified constant value. The comparing means generates a signal indicating that the current field element is a root when the sum is equal to the specified constant value.

Advantageously, the present provides a circuit and a method that can determine the roots of an error locator polynomial in a more efficient and timely manner by evaluating a plurality of field elements in parallel. In addition, the present invention allows sub-Chien search circuits to share a set of storage elements, resulting in significant savings in cost. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

Prior Art

Prior Art

Prior Art

DETAILED DESCRIPTION OF THE PREFERRED EMBODIMENTS

An invention is described for a circuit and method for determining error locations by efficiently finding the roots of an error locator polynomial. It will be obvious, however, to one skilled in the art, that the present invention may be practiced without some or all of these specific details. In other instances, well known process operations have not been described in detail in order not to unnecessarily obscure the present invention.

The present invention provides circuits and methods for determining error locations by efficiently finding the roots of an error locator polynomial using a parallel Chien search circuit. The parallel Chien search circuit determines the roots by evaluating the error locator polynomial at a set of $GF(2^m)$ elements in parallel, where m is the number of bits in a symbol such as a byte. The roots thus generated correspond to the error locations in a set of data such as a sector. In a preferred embodiment, the present invention employs a set of nonzero elements in $GF(2^8)$ or $GF(256)$ elements that include 255 field elements from $\alpha^0$ to $\alpha^{254}$. Although the present invention employs these field elements, those skilled in the art will readily appreciate that it may utilize any suitable number of field elements.

The Chien search circuit receives a set of coefficients defining an error locator polynomial and finds a set of roots, preferably up to L roots. The maximum degree of the error locator polynomial and the maximum number of roots are equal to the number of correctable errors in a data sector. The determination of L roots, in turn, allows an EDAC circuitry to correct up to L errors.

Figure 4:
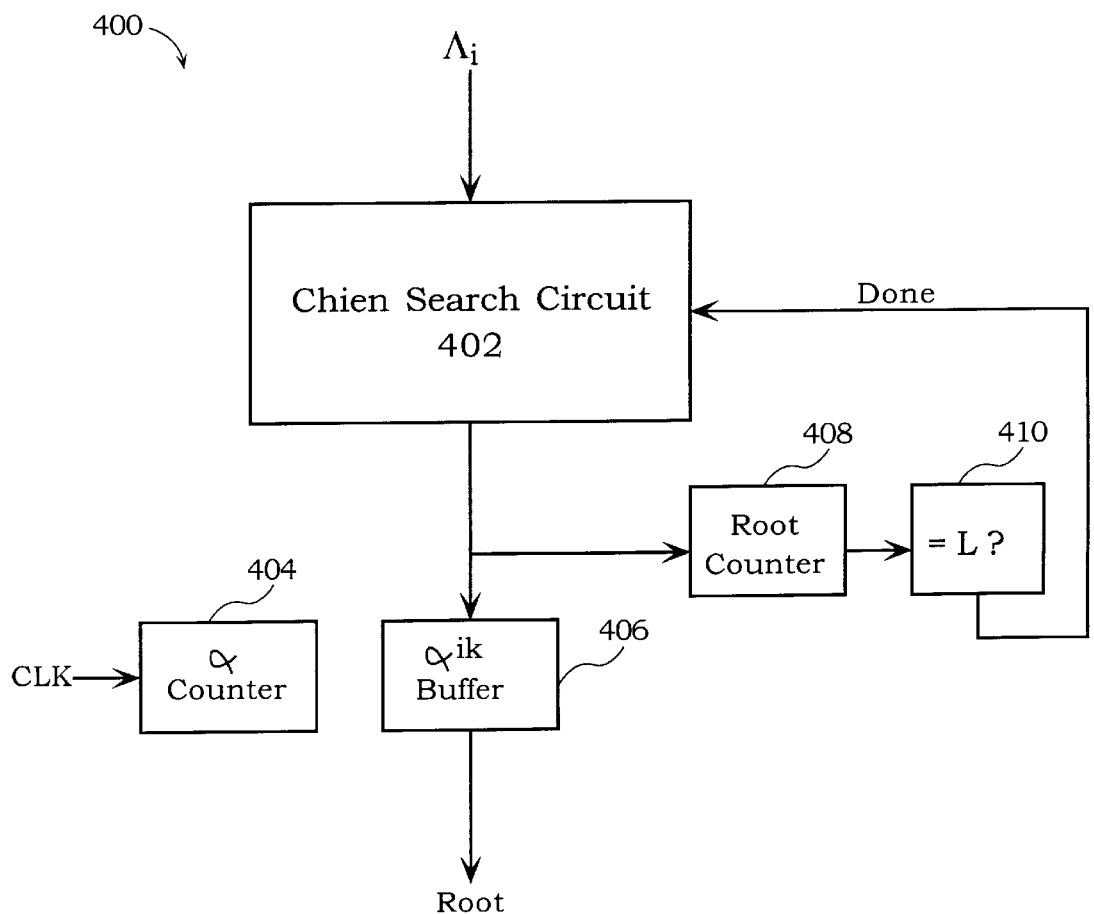
FIG. 4 illustrates an exemplary circuit for outputting the roots of an error locator polynomial using a parallel Chien search circuit in accordance with one embodiment of the present invention.

FIG. 4 illustrates an exemplary circuit 400 for outputting the roots of an error locator polynomial using a parallel Chien search circuit. The circuit 400 includes a Chien search circuit 402, a buffer 406 for holding the current field element value of $\alpha^{i_k}$, a field element $\alpha$ counter 404, a root counter 408, and a comparator 410. The $\alpha$ counter 404 updates the buffer 406 with a current $\alpha^{i_k}$ associated with a current clock cycle in response to the clock signal CLK.

At each clock cycle, the Chien search circuit 402 generates a signal indicating whether a root has been found. The Chien search circuit 402 is coupled to provide the signal to the buffer 406 and the root counter 408. If a root to the error locator polynomial has been found, the content of the $\alpha$ counter 404 is copied to the buffer 406 for storage and the root counter 408 is incremented in response. The signal thus enables capture of the determined root while allowing the root counter 408 to keep a count of the total number of roots that have been found.

The root counter 408 provides the count of the total number of roots that have been found to the comparator 410, which compares the counted roots to the predefined number L, which is the maximum number of roots as described above. If the counted number of roots is equal to L, all the roots have been found. In this case, the comparator 410 provides a signal DONE to the Chien search search 402 to stop the search for any more roots.

ECC schemes typically implement Reed-Solomon code using N-way interleave format. In a shortened code configuration such as the N-way interleave configurations for 512-byte sector, some error locations (e.g., approximately 1–2/N error locations) do not exist. By way of an example, for a 3-way interleaved sector of 512 bytes, only about two-thirds of total 255 field elements need to be tested. If error locations are within a field element range of $\alpha^0$ to $\alpha^{180}$, the field elements can be evaluated from $\Lambda(\alpha^0)$ to $\Lambda(\alpha^{-180})$ rather than from $\Lambda(\alpha^0)$ to $\Lambda(\alpha^{180})$ since $\Lambda(z)$ has roots that are inverse of the error locators. Accordingly, each coefficient $\Lambda_i$ of the error locator polynomial can be repeatedly multiplied by $\alpha^{-i}$ instead of the conventional method of multiplying by $\alpha^i$. In the following examples, the Chien search circuits of the present invention will be illustrated with reference to an error locator polynomial of degree 6 having 6 coefficients, $\Lambda_i$ through $\Lambda_6$. However, it should be appreciated that those skilled in the art will recognize that the present invention may be implemented using any number of degrees and coefficients of error locator polynomial.

After all legitimate error locations have been tested, the total number of errors found should be same as the degree of the error locator polynomial, $\Lambda(z)$. Otherwise, the ECC decoder detects an uncorrectable error. The maximum number of roots that can be detected is equal to the degree, L, of the error locator polynomial $\Lambda(z)$. If L roots are found in legitimate error range, no more errors exist beyond the legitimate error range. Hence, checking the total number of roots in legitimate range equal to the degree L of the error locator polynomial is sufficient and does not degrade the detection capability. FIG. 4 implements this feature by using the root counter 408 and the comparator 410.

Figure 1:
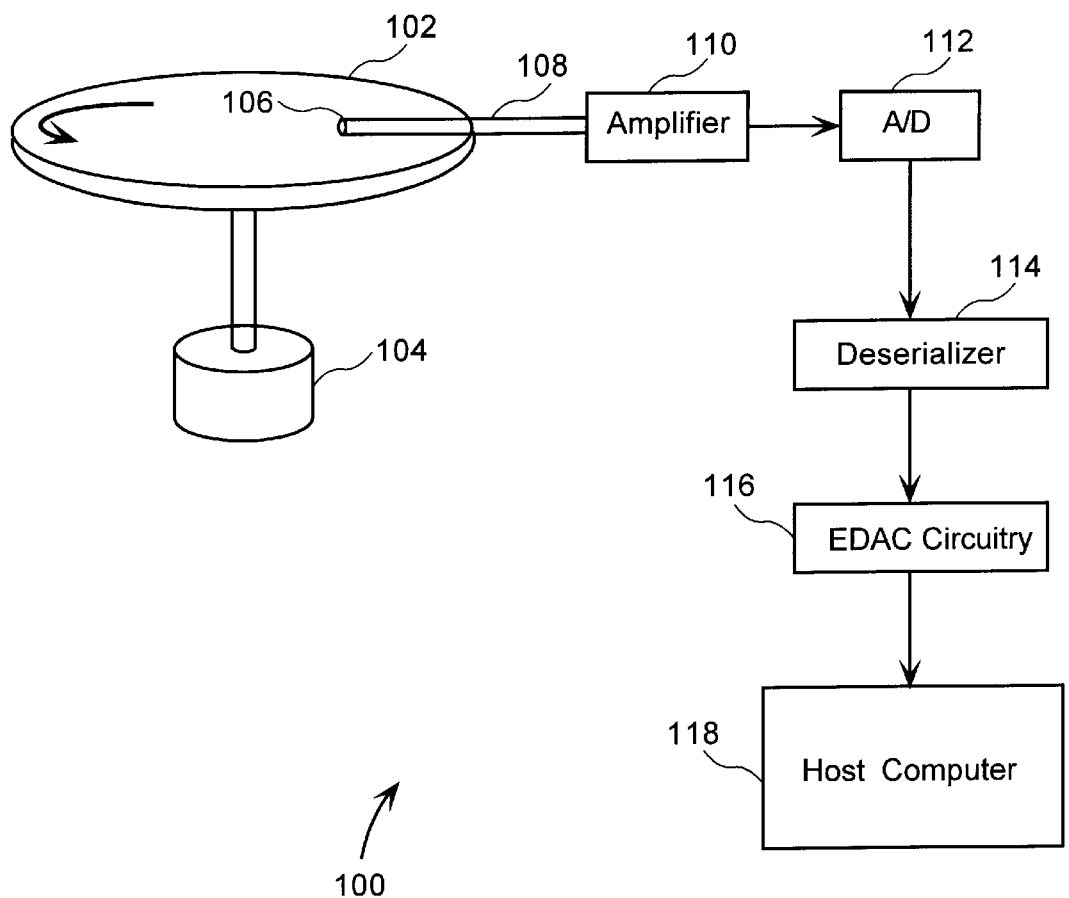
FIG. 1 illustrates a block diagram of a conventional computer system including a host computer that receives data from a disk in a hard disk drive.
Figure 2:
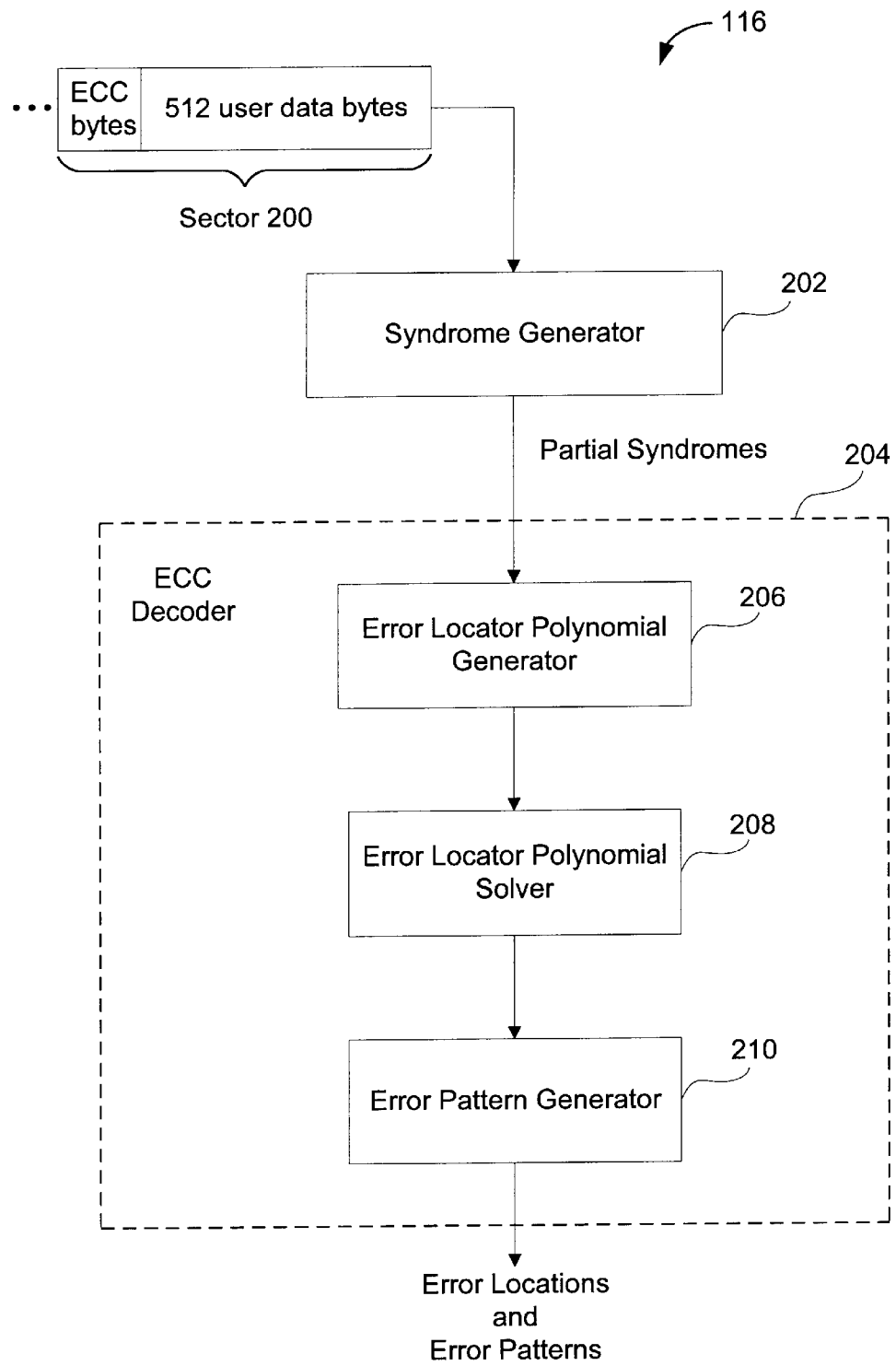
FIG. 2 shows a more detailed block diagram of the EDAC circuitry that utilizes an ECC scheme.
Figure 3:
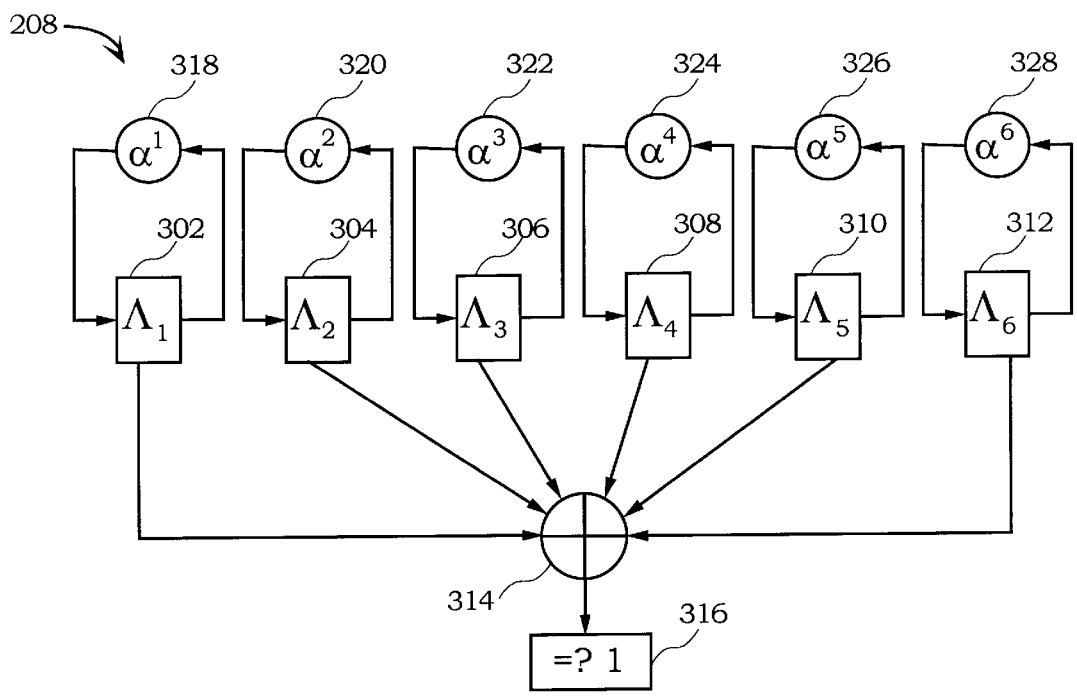
FIG. 3 illustrates a conventional Chien search circuit for finding a set of error locations by evaluating an error locator polynomial at all elements from $\alpha^0$ to $\alpha^{254}$ sequentially in a field $GF(2^8)$.
Figure 5:
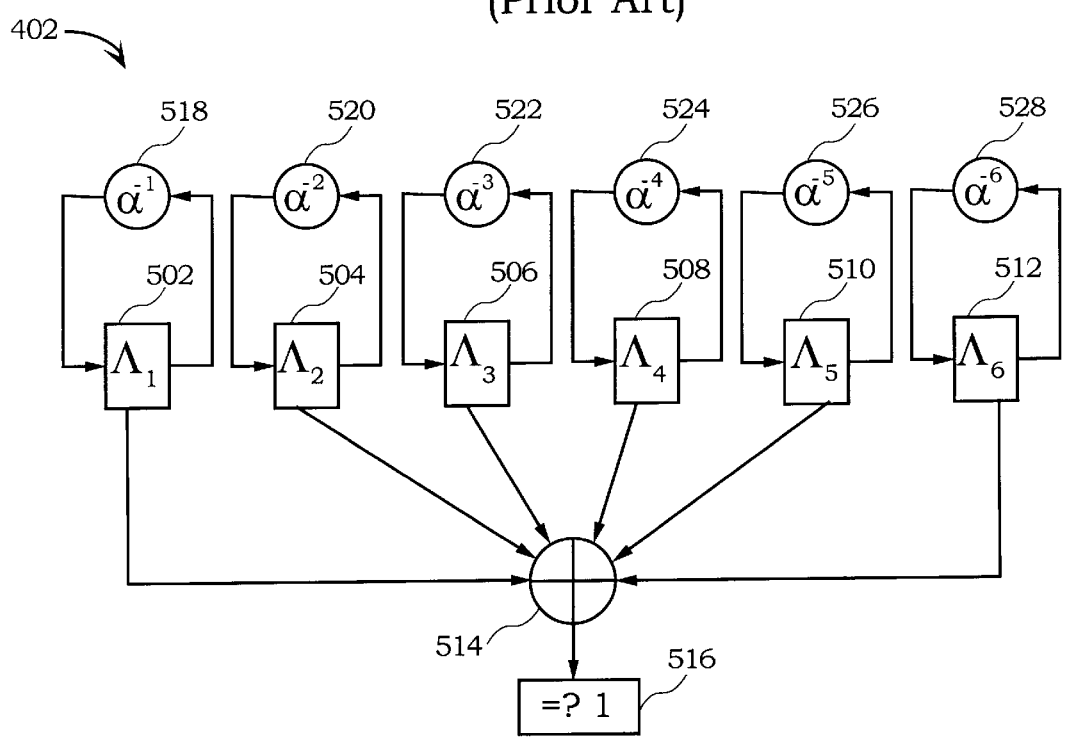
FIG. 5 illustrates an exemplary Chien search circuit that implements the inverse constant multipliers ($\alpha^{-i}$s) in accordance with one embodiment of the present invention.

FIG. 5 illustrates an exemplary Chien search circuit 402 that implements the inverse constant multipliers ($\alpha^{-i}$s) in accordance with one embodiment of the present invention. The Chien search circuit 402 includes a set of storage elements 502, 504, 506, 508, 510, and 512 (502 to 512 hereinafter), a set of constant GF multipliers 518, 520, 522, 524, 526, and 528 (518 to 526 hereinafter), an adder 514, and a comparator 516. The storage elements 502 to 512 are initially configured to receive and store a set of coefficients $\Lambda_1$, $\Lambda_2$, $\Lambda_3$, $\Lambda_4$, $\Lambda_5$, and $\Lambda_6$, respectively. The storage elements 502 to 512 are coupled to and associated with constant GF multipliers 518 to 528, respectively, in a feedback configuration.

The constant multipliers 518 to 528 are operative to multiply constants $\alpha^{-1}$, $\alpha^{-2}$, $\alpha^{-3}$, $\alpha^{-4}$, $\alpha^{-5}$, and $\alpha^{-6}$, respectively, with the error locator polynomial coefficients $\Lambda_1$, $\Lambda_2$, $\Lambda_3$, $\Lambda_4$, $\Lambda_5$, and $\Lambda_6$, respectively. The resulting products are then stored back in the associated storage elements 502 to 512, respectively. In this feedback configuration, each of the storage elements 502 to 512 provides a coefficient in the first clock cycle and a product in the subsequent clock cycles to the associated constant multiplier, which then feeds the result back to the associated storage element for storage.

The adder 514 is coupled to each of the storage elements 502 to 512 to receive their content. At each clock cycle, the adder 514 receives the contents of the storage elements 502 to 512 and computes the sum of the received values. The sum is then fed to the comparator 516, which determines whether the sum is equal to a constant value of 1. If so, the comparator generates a signal that indicates that the field element associated with a particular clock cycle is a root. For example, if the comparator 516 determines that the sum from the adder 514 is equal to 1 for a clock cycle i corresponding to field element $\alpha^i$, the comparator 516 generates a signal indicating that the field element $\alpha^i$ is a root.

Figure 6:
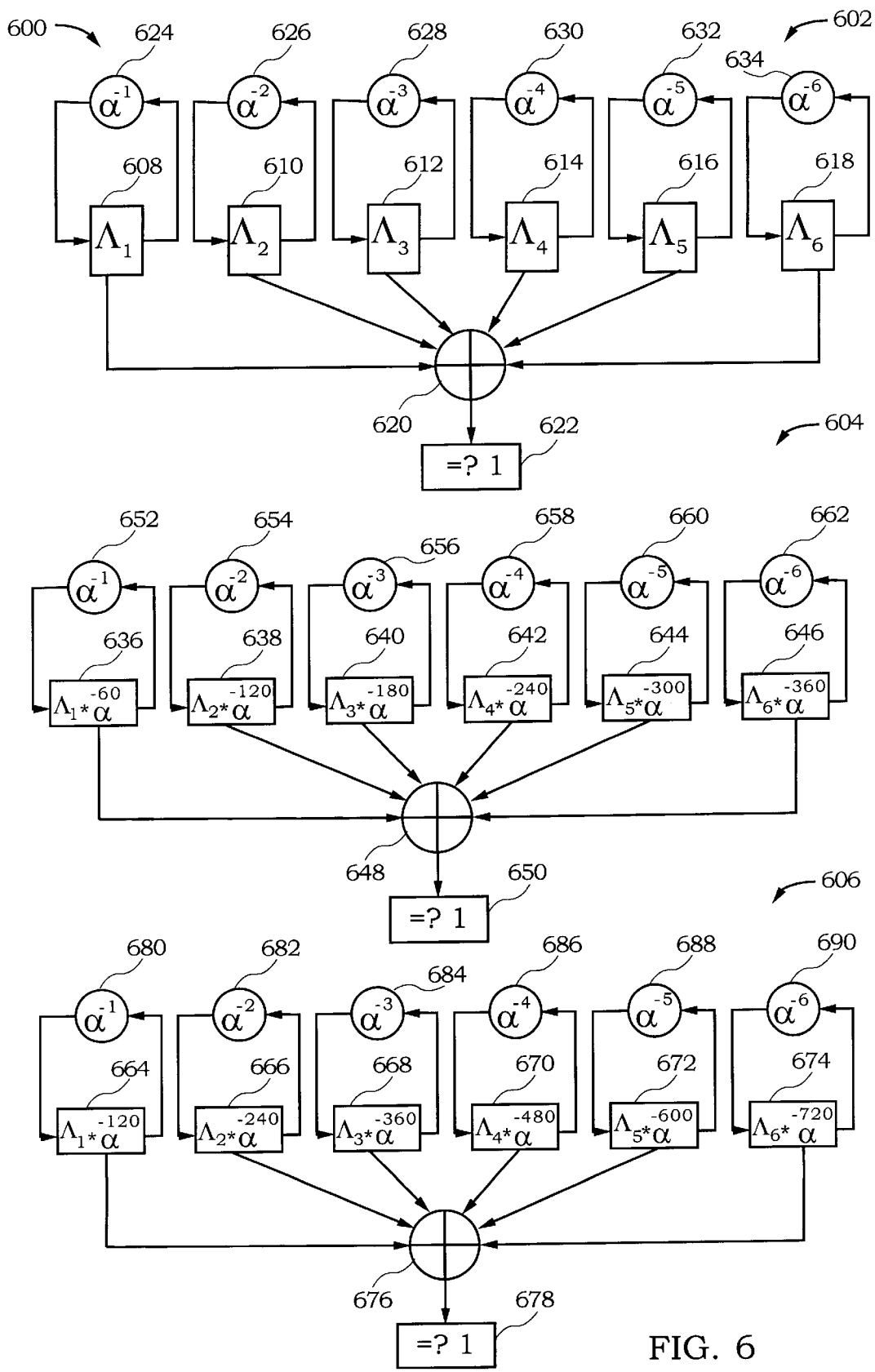
FIG. 6 shows an exemplary parallel Chien search circuit that includes three parallel sub-Chien search circuits, which run concurrently to determine roots within an $\alpha$ range from $\alpha^0$ to $\alpha^{180}$.

FIG. 6 shows an exemplary parallel Chien search circuit 600 that includes three parallel sub-Chien search circuits 602, 604, and 606, which run concurrently to determine roots within an a range from $\alpha^0$ to $\alpha^{180}$. The sub-Chien search circuits 602, 604, and 606 effectively divide the processing of the $\alpha$ values into three blocks. Specifically, the sub-Chien search circuit 602 searches roots within an a range from $\alpha^0$ to $\alpha^{-59}$; the sub-Chien search circuit 604 finds roots within an $\alpha$ range from $\alpha^{-60}$ to $\alpha^{-119}$; and the sub-Chien search circuit 606 determines roots within an $\alpha$ range from $\alpha^{-120}$ to $\alpha^{-180}$.

Structurally, the sub-Chien search circuits 602, 604, and 606 contain the similar storage elements and constant multipliers as the Chien search circuit 500 of FIG. 5. The sub-Chien search circuit 602 includes a set of storage elements 608, 610, 612, 614, 616, and 618, a set of constant GF multipliers 624, 626, 628, 630, 632, and 634, an adder 620, and a comparator 622. Similarly, the sub-Chien search circuit 604 includes storage elements 636, 638, 640, 642, 644, and 646, constant GF multipliers 652, 654, 656, 658, 660, and 662, an adder 648, and a comparator 650. Likewise, the sub-Chien search circuit 606 includes a set of storage elements 664, 666, 668, 670, 672, and 674, a set of constant GF multipliers 680, 682, 684, 686, 688, and 690, an adder 676, and a comparator 678.

In order to implement the different a ranges, each of the sub-Chien search circuits 602, 604, and 606 is loaded with different initialization values. The storage elements 608, 610, 612, 614, 616, and 618 of the sub-Chien search circuit 602 initially receives and stores the six polynomial coefficients, $\Lambda_1$, to $\Lambda_6$, respectively. In contrast, the storage elements 636, 638, 640, 642, 644, and 646 of the sub-Chien search circuit 604 initially receives and stores six pre-multiplied polynomial coefficients $\Lambda 1^*(\alpha^{-1})^{60}$, $\Lambda 2^*(\alpha^{-2})^{60}$, $\Lambda 3^*(\alpha^{-3})^{60}$, $\Lambda 4^*(\alpha^{-4})^{60}$, $\Lambda 5^*(\alpha^{-5})^{60}$, and $\Lambda 6^*(\alpha^{-6})^{60}$, respectively. On the other hand, the storage elements 664, 666, 668, 670, 672, and 674 of the sub-Chien search circuit 606 initially receives and stores six pre-multiplied polynomial coefficients $\Lambda 1^*(\alpha^{-1})^{120}$, $\Lambda 2^*(\alpha^{-2})^{120}$, $\Lambda 3^*(\alpha^{-3})^{120}$, $\Lambda 4^*(\alpha^{-4})^{120}$, $\Lambda 5^*(\alpha^{-5})^{120}$, and $\Lambda 6^*(\alpha^{-6})^{120}$, respectively. With these initial values, the sub-Chien search circuits 602, 604, and 606 operates in a similar manner to determine the roots within the respective ranges as the Chien search circuit 500 of FIG. 5.

The storage configuration of the different initial values divides the root searching process to determine the roots by repeated multiplication in a feedback configuration in 60 clock cycles at most. The sub-Chien search circuit 602 searches roots within the $\alpha$ range from $\alpha^0$ to $\alpha^{-59}$; the sub-Chien search circuit 604 finds roots within the $\alpha$ range from $\alpha^{-60}$ to $\alpha^{-119}$; and the sub-Chien search circuit 606 determines roots within the $\alpha$ range from $\alpha^{-120}$ to $\alpha^{-180}$. Accordingly, the Chien search circuit 600 determines all the roots of the error locator polynomial in parallel by assigning portions of the search range to a plurality of sub-Chien search circuits. Even though the Chien search circuit 600 divides the search range into three parts and employs three sub-Chien search circuits 602, 604, and 606 for each of the three parts, it should be appreciated that the Chien search circuit 600 can also divide the search range into N parts and utilize N sub-Chien search circuits for each of the parts.

Figure 7:
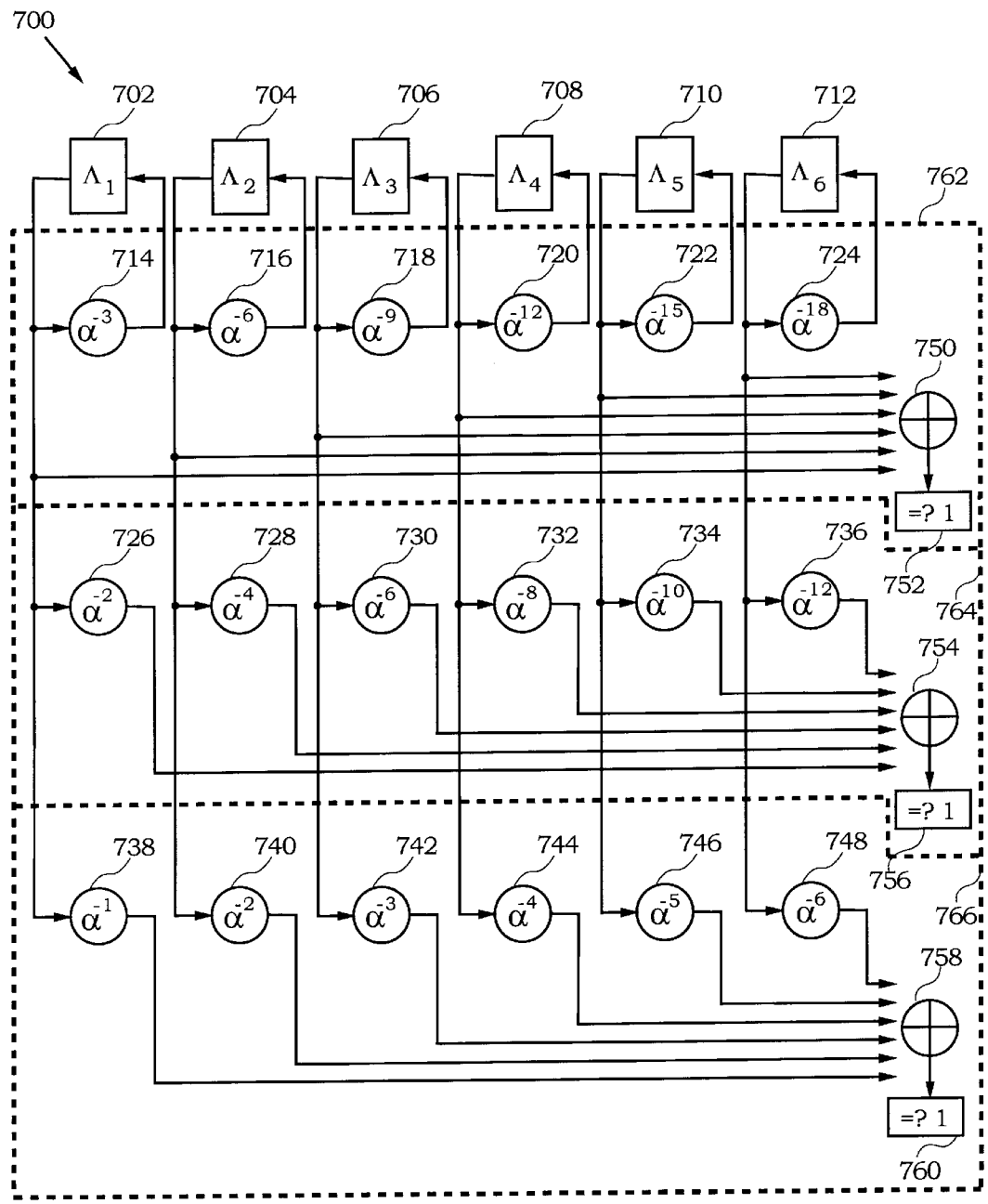
FIG. 7 illustrates a parallel Chien search circuit utilizing a shared set of storage elements in accordance with one embodiment of the present invention.

FIG. 7 illustrates a parallel Chien search circuit 700 utilizing a shared set of storage elements in accordance with one embodiment of the present invention. The parallel Chien search circuit 700 includes a set of shared storage elements 702, 704, 706, 708, 710, and 712 for receiving and storing a set of error locator polynomial coefficients, $\Lambda_1, \Lambda_2, \Lambda_3, \Lambda_4, \Lambda_5,$ and $\Lambda_6$, respectively. The parallel Chien search circuit 700 also includes three parallel sub-Chien search circuits 762, 764, and 766 for searching three consecutive field elements simultaneously by accessing the content of the storage elements 702, 704, 706, 708, 710, and 712.

The sub-Chien search circuits 762, 764, and 766 search for roots in every ith, (i–2)th, (i–1)th field elements, respectively, in parallel where i is an integer starting from 0. For example, the first sub-Chien search circuit 762 searches for roots in every third field elements defined by a sequence field elements $\alpha^0, \alpha^{-3}, \alpha^{-6}$, and so on. On the other hand, the second sub-Chien search circuit 764 finds roots in every third field elements defined as a sequence of field elements $\alpha^{-2}, \alpha^{-5}, \alpha^{-8}$, and so on. Similarly, the third sub-Chien search circuit 766 searches for roots in every third field elements defined as a sequence of field elements $\alpha^{-1}, \alpha^{-4}, \alpha^{-7}$, etc.

The first sub-Chien search circuit 762 includes a set of constant GF multipliers 714, 716, 718, 720, 722, and 724, an adder 750, and a comparator 752. The sub-Chien search circuit 762 searches roots in every third field elements starting from $\alpha^0$. At each clock cycle the contents of the storage elements are fed to the adder 750 to generate a sum. The sum is then fed to the comparator 752, which generates a signal indicating whether the field element searched is a root. For example, if the sum is equal to 1, the signal indicates that the field element is a root. Otherwise, the signal indicates that the field element is not a root.

The constant multipliers 714, 716, 718, 720, 722, and 724 are coupled to the storage elements 702, 704, 706, 708, 710, and 712, respectively, to receive the contents of the respective storage elements for multiplication with constants $\alpha^{-3}, \alpha^{-6}, \alpha^{-9}, \alpha^{-12}, \alpha^{-15}$, and $\alpha^{-18}$, respectively. The products are then fed back to the storage elements 702, 704, 706, 708, 710, and 712 for storage in a feedback configuration.

On the other hand, the sub-Chien search circuit 764 searches roots in every third field elements starting from $\alpha^{-2}$. The second sub-Chien search circuit 764 includes a plurality of constant GF multipliers 726, 728, 730, 732, 734, and 736, an adder 754, and a comparator 756. The constant multipliers 726, 728, 730, 732, 734, and 736 are coupled to receive the contents of the storage elements 702, 704, 706, 708, 710, and 712, respectively, at each clock cycle. The constant multipliers 726, 728, 730, 732, 734, and 736 multiply the values received from the associated storage elements with constants $\alpha^{-2}, \alpha^{-4}, \alpha^{-6}, \alpha^{-8}, \alpha^{-10}$, and $\alpha^{-12}$, respectively. At each clock cycle, the adder 754 is coupled to receive the products from the constant multipliers 726, 728, 730, 732, 734, and 736 and generates a sum of all the received products. The comparator 756 is coupled to receive the sum from the adder 754 for generating a signal that indicates whether the current field element is a root of the error locator polynomial.

The sub-Chien search circuit 766 searches roots in every third field elements starting from $\alpha^{-1}$. The third sub-Chien search circuit 766 includes a set of constant GF multipliers 738, 740, 742, 744, 746, and 748, an adder 758, and a comparator 760. The constant multipliers 738, 740, 742, 744, 746, and 748 is coupled to receive the contents of the storage elements 702, 704, 706, 708, 710, and 712, respectively, at each clock cycle. The constant multipliers 738, 740, 742, 744, 746, and 748 multiply the values received from the coupled storage elements with constants $\alpha^{-1}, \alpha^{-2}, \alpha^{-3}, \alpha^{-4}, \alpha^{-5}$, and $\alpha^{-6}$, respectively. The adder 758 is coupled to receive the products from the constant multipliers 738, 740, 742, 744, 746, and 748 at each clock cycle. The adder 758 generates a sum of all the received products. The comparator 760 is coupled to receive the sum from the adder 758 for generating a signal that indicates whether the current field element is a root of the error locator polynomial.

It should be appreciated that the Chien search circuit 700 may also be implemented as a scalable circuit using N number of sub-Chien search circuits with one set of storage elements. In this case, each sub-Chien search circuit searches for roots at every Nth field element. This Chien search circuit provides fast and efficient means of searching for roots in parallel without the cost of additional storage elements.

Figure 8:
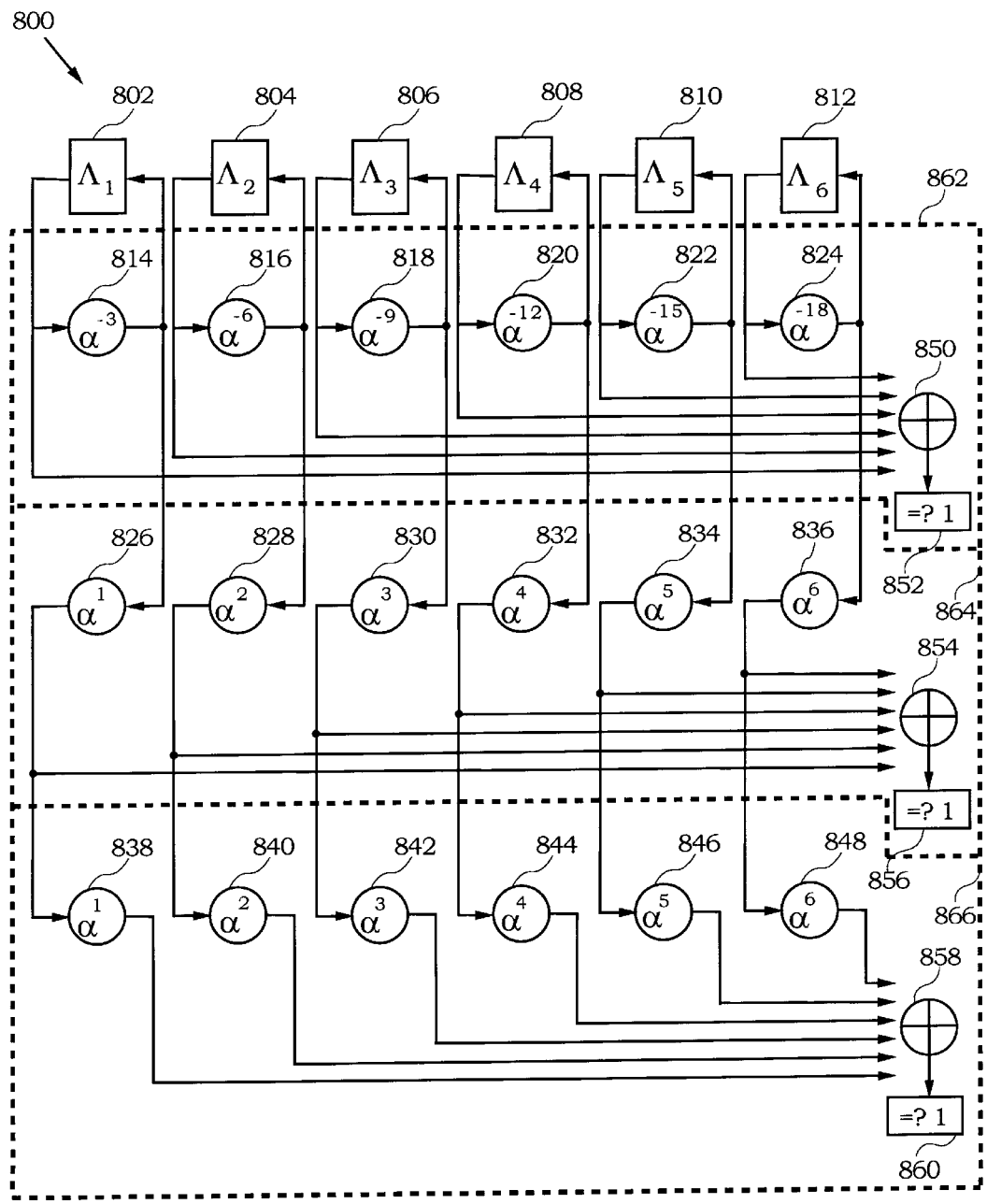
FIG. 8 shows a Chien search circuit that modifies a set of constant multipliers in the Chien search circuit in FIG. 7 in accordance with another embodiment of the present invention.

FIG. 8 shows a Chien search circuit 800 that modifies a set of constant multipliers in the Chien search circuit 700 in FIG. 7 in accordance with another embodiment of the present invention. Like the Chien search circuit 700, the Chien search circuit 800 includes a set of storage elements 802, 804, 806, 808, 810, and 812, and three sub-Chien search circuits 862, 864, and 866. The first sub-Chien search circuit 862 includes constant GF multipliers 814, 816, 818, 820, 822, and 824, an adder 850, and a comparator 852. The first sub-Chien search circuit 862 is substantially similar to the first sub-Chien search circuit 762 and operates in the same manner as described above in conjunction with FIG. 7. For example, the constant multipliers 814, 816, 818, 820, 822, and 824 receive the contents of the storage elements 802, 804, 806, 808, 810, and 812, respectively, and multiplies the contents with constants $\alpha^{-3}, \alpha^{-6}, \alpha^{-9}, \alpha^{-12}, \alpha^{-15}$, and $\alpha^{-18}$, respectively, to generate products. The products are fed back to the storage elements 802, 804, 806, 808, 810, and 812 for storage.

The sub-Chien search circuit 864 also operates similar to the sub-Chien search circuit 764. The second sub-Chien search circuit 864 includes a plurality of constant GF multipliers 826, 828, 830, 832, 834, and 836, an adder 854, and a comparator 856. However, the constant GF multipliers 826, 828, 830, 832, 834, and 836 are coupled to receive the products from the constant GF multipliers 814, 816, 818, 820, 822, and 824, respectively. It should be noted that the sub-Chien search circuit 864 receives the products from the constant multipliers of the sub-Chien search circuit 862 after only a few gate delays and within the same clock cycle.

The constant multipliers 826, 828, 830, 832, 834, and 836 multiply the values received from the associated constant multipliers of the sub-Chien search circuit 862 with constants $\alpha^1, \alpha^2, \alpha^3, \alpha^4, \alpha^5$, and $\alpha^6$, respectively. Since the constant multipliers 826, 828, 830, 832, 834, and 836 are chained to the constant multipliers 814, 816, 818, 820, 822, and 824, respectively, the outputs of the constant multipliers 826, 828, 830, 832, 834, and 836 are the same as the outputs of the constant multipliers 726, 728, 730, 732, 734, and 736, respectively. For example, the chaining of constant multipliers 824 and 836 involves multiplying the respective constants $\alpha^{-18}$ and $\alpha^6$. The product of these constants produces $\alpha^{-12}$, which is the constant associated with the constant multiplier 736.

At each clock cycle, the adder 854, which is coupled to receive the products from the constant multipliers 826, 828, 830, 832, 834, and 836, generates a sum of all the received products. The comparator 856 is coupled to receive the sum from the adder 854 for generating a signal that indicates whether the current field element is a root of the error locator polynomial. Due to the delay introduced by the chaining, the sub-Chien search circuit 864 generates the signal after the sub-Chien search circuit 862 generates its signal but within the same clock cycle.

The sub-Chien search circuit 866 operates similar to the sub-Chien search circuit 766 of FIG. 7 by searching roots in every third field elements starting from $\alpha^{-1}$. The third sub-Chien search circuit 866 includes a set of constant GF multipliers 838, 840, 842, 844, 846, and 848, an adder 858, and a comparator 860. However, the constant multipliers 838, 840, 842, 844, 846, and 848 are coupled to receive the products from the constant GF multipliers 826, 828, 830, 832, 834, and 836, respectively.

The constant multipliers 838, 840, 842, 844, 846, and 848 multiply the values received from the associated constant multipliers of the sub-Chien search circuit 864 with constants $\alpha^1, \alpha^2, \alpha^3, \alpha^4, \alpha^5$, and $\alpha^6$, respectively. Since the constant multipliers 838, 840, 842, 844, 846, and 848 are chained to the constant multipliers 826, 828, 830, 832, 834, and 836, respectively, the outputs of the constant 838, 840, 842, 844, 846, and 848 are the same as the outputs of the constant multipliers 738, 740, 742, 744, 746, and 748, respectively. For example, the chaining of constant multipliers 836 and 848 involves multiplying the constants $\alpha^{-12}$ and $\alpha^6$. The product of these constants produces $\alpha^{-6}$, which is the constant associated with the constant multiplier 748.

The adder 858 is coupled to receive the products from the constant multipliers 838, 840, 842, 844, 846, and 848 at each clock cycle. The adder 858 generates a sum of all the received products. The comparator 860 is coupled to receive the sum from the adder 858 for generating a signal that indicates whether the current field element is a root of the error locator polynomial.

The Chien search circuit 800 determines the roots in sequence and in parallel. Specifically, the sub-Chien search circuit 862 finds the roots of the form $\alpha^0, \alpha^{-3}, \alpha^{-6}$, etc. The sub-Chien search circuit 864 finds roots of the form $\alpha^{-2}, \alpha^{-5}, \alpha^{-8}$, and so on. and the sub-Chien search circuit 864 finds roots of the form $\alpha^{-1}, \alpha^{-4}, \alpha^{-7}$, etc. During each clock cycle, the Chien search circuit 800 may find up to three roots.

The Chien search circuit 800 may also be implemented as a scalable circuit using N number of series chained sub-Chien search circuits with one set of storage elements. The Chien search circuit 800 has an advantage of being less costly to implement than the Chien search circuit 700 because it uses lower degree of α constant multipliers. As is well known in the art, higher degree of constant multipliers requires larger die size in an integrated circuit, which translates into higher cost. At the same time, the Chien search circuit 800 provides much of the benefits associated with the parallel searching of the roots without the cost of additional storage elements.

Figure 9:
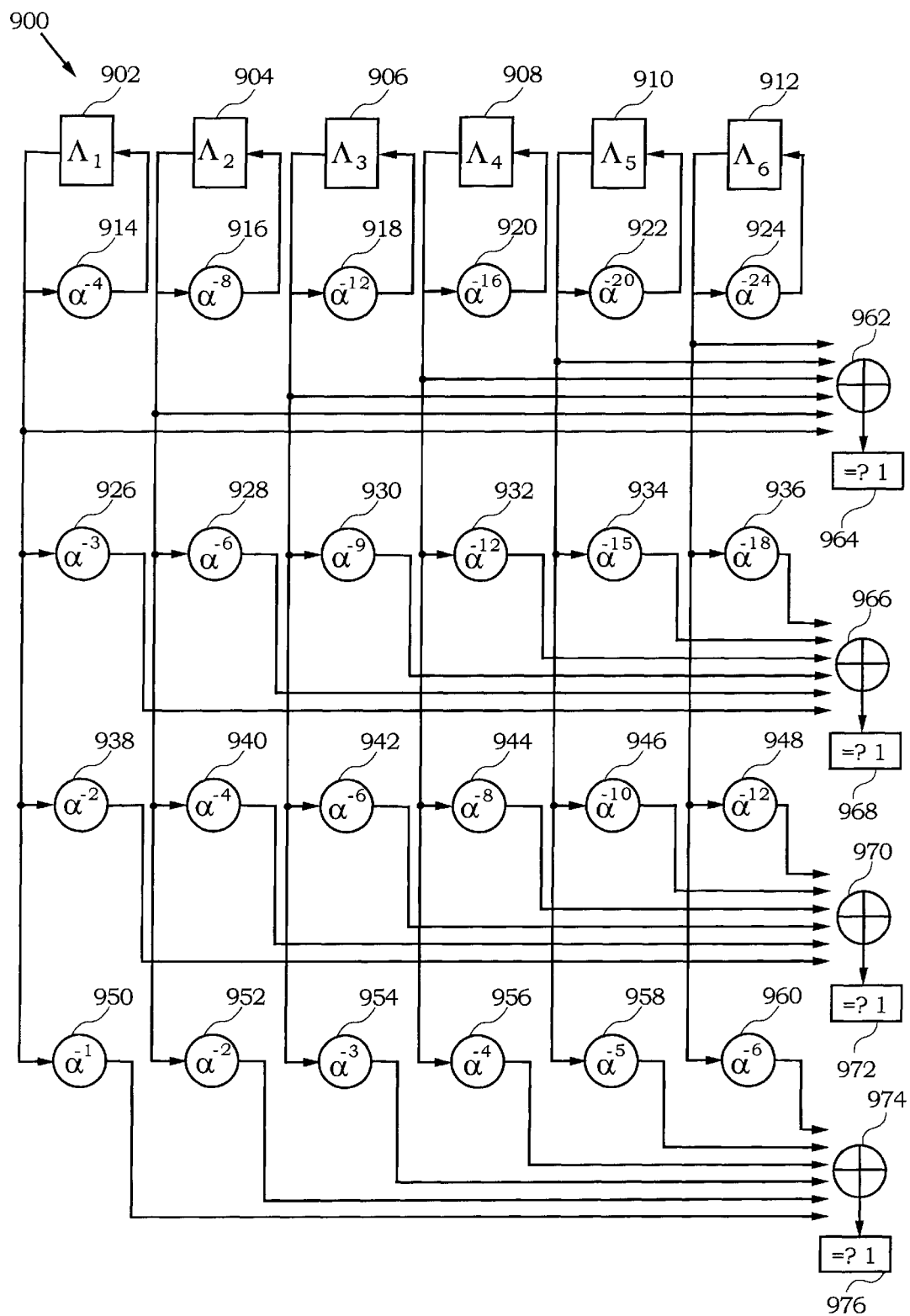
FIG. 9 illustrates a scaled Chien search circuit that adds another sub-Chien search circuit to the Chien search circuit of FIG. 7.

FIG. 9 illustrates a scaled Chien search circuit 900 that adds another sub-Chien search circuit to the Chien search circuit 700 of FIG. 7. The additional sub-Chien search circuit includes constant multipliers 950, 952, 954, 956, 958, and 960, and an adder 974, and a comparator 976. The Chien search circuit 900 operates in a manner similar to the Chien search circuit 700. The additional sub-Chien search circuit allows four-way parallel search of roots with each sub-Chien search circuit searching every fourth field elements.

While the present invention has been described in terms of several preferred embodiments, there are alterations, permutations, and equivalents which fall within the scope of this invention. It should also be noted that there are alternative ways of implementing both the device and device of the present invention. It is therefore intended that the following appended claims be interpreted as including all such alterations, permutations, and equivalents as fall within the true spirit and scope of the present invention.

What is claimed is:

1. A Chien search circuit for determining roots of an error locator polynomial that is defined by a set of coefficients, the circuit comprising:

N sub-Chien search circuits, each sub-Chien search circuit configured to sequentially evaluate a subset of field elements from a specified set of field elements in parallel with other sub-Chien search circuits, each of the sub-Chien search circuit including:

a set of storage elements for storing a set of values, the storage elements initially receiving and storing the set of coefficients as the set of values, one storage element for each coefficient;

a set of constant multipliers coupled to receive the set of values from the set of storage elements, one constant multiplier being associated with one storage element, each of the constant multipliers being associated with a constant field element and being configured to multiply the received value and the constant field element to generate a product, wherein each of the constant multipliers is coupled to feed the product to the associated storage element for storage;

an adder coupled to receive the stored set of values from the set of storage elements for generating a sum of the received set of values for a current field element being evaluated; and a comparator coupled to receive the sum for comparing the sum to a specified constant value, the comparator generating a signal indicating that the current field element is a root when the sum is equal to the specified constant value.

2. The circuit as recited in claim 1, wherein N is an integer greater than 1.

3. The circuit as recited in claim 1, wherein N is 3.

4. The circuit as recited in claim 1, wherein N is 4.

5. The circuit as recited in claim 1, wherein the field elements are GF field elements.

6. The circuit as recited in claim 1, wherein the subset of field elements includes every Nth field element from the specified field elements.

7. The circuit as recited in claim 1, wherein the field elements include field elements $\alpha^0$ through $\alpha^{180}$.

8. The circuit as recited in claim 1, wherein the N sub-Chien search circuits share the set of storage elements.

9. The circuit as recited in claim 1, wherein the constant multipliers for the N sub-Chien search circuits are coupled in series such that an ith sub-Chien search circuit receives the product from the (i−1)th sub-Chien search circuit.

10. The circuit as recited in claim 1, wherein the error locator polynomial includes L coefficients and wherein each of the N sub-Chien search circuits includes L storage elements.

11. The circuit as recited in claim 10, wherein each of the N sub-Chien search circuits share the L storage elements.

12. The circuit as recited in claim 10, wherein the each of the N sub-Chien search circuits includes L constant multipliers.

13. The circuit as recited in claim 1, wherein the constant field elements are selected from the set of field elements.

14. The circuit as recited in claim 1, wherein the specified constant value is 1.

15. The circuit as recited in claim 1, wherein the constant field elements are inverse constant field elements.

16. A method for determining roots to an error locator polynomial that is defined by a set of coefficients, the method comprising:

a) storing the set of coefficients as a set of values;
b) partitioning a set of field elements into N subsets; and
c) for each of the N subsets of field elements,
   i) generating a sum of the set of values for a current field element being evaluated;
   ii) multiplying the set of values and a set of constant field elements to generate a set of products;
   iii) storing the set of products as the set of values;
   iv) comparing the sum to a specified constant value to generate a signal indicating that the current field element is a root when the sum is equal to the specified constant value; and
   v) repeating operations i) through iv) until a specified number of roots have been found, wherein each of the N subsets of field elements are processed in parallel with the other subsets to determine the roots within each of the N subsets.

17. The method as recited in claim 16, wherein N is an integer greater than 1.

18. The method as recited in claim 16, wherein N is 3.

19. The method as recited in claim 16, wherein N is 4.

20. The method as recited in claim 16, wherein the field elements are GF field elements.

21. The method as recited in claim 16, wherein the subset of field elements includes every Nth field element from the specified field elements.

22. The method as recited in claim 16, wherein the set of field elements includes M+1 field elements from $\alpha^0$ through $\alpha^M$.

23. The method as recited in claim 16, wherein the coefficients are stored in a set of storage elements, which are used to store the set of values.

24. The method as recited in claim 16, wherein the set of products generated from the ith subset of field elements is provided to the (i+1)th subset of field elements as a set of values.

25. The method as recited in claim 16, wherein the error locator polynomial includes L coefficients, which are stored in L storage elements.

26. The method as recited in claim 25, wherein the L storage elements are shared for processing of the N subsets of field elements.

27. The method as recited in claim 25, wherein L constant multipliers multiplies the set of values and the set of constant field elements.

28. The method as recited in claim 16, wherein the constant field elements are selected from the set of field elements.

29. The method as recited in claim 16, wherein the specified constant value is 1.

30. The method as recited in claim 16, wherein the constant field elements are inverse GF field elements.

31. A Chien search circuit for determining roots of an error locator polynomial that is defined by a set of coefficients, the circuit comprising:

N sub-Chien search circuits, each sub-Chien search circuit configured to sequentially evaluate a subset of field elements from a specified set of field elements in parallel with other sub-Chien search circuits, each of the sub-Chien search circuit including:

storing means for storing a set of values, the storing means initially receiving and storing the set of coefficients as the set of values;

multiplying means for multiplying the set of values and a set of constant field elements to generate a set of products, the multiplying means being configured to feed the set of products back to the storing means for storage;

adding means for receiving the stored set of values to generate a sum of the values for a current field element being evaluated; and comparing means configured to receive the sum for comparing the sum to a specified constant value, the comparing means generating a signal indicating that the current field element is a root when the sum is equal to the specified constant value.

32. The circuit as recited in claim 31, wherein N is an integer greater than 1.

33. The circuit as recited in claim 31, wherein N is 3.

34. The circuit as recited in claim 31, wherein N is 4.

35. The circuit as recited in claim 31, wherein the field elements are GF field elements.

36. The circuit as recited in claim 31, wherein the subset of field elements includes every Nth field element from the specified field elements.

37. The circuit as recited in claim 31, wherein the field elements includes M field elements from $\alpha^0$ through $\alpha^M$.

38. The circuit as recited in claim 31, wherein the N sub-Chien search circuits share the storing means.

39. The circuit as recited in claim 31, wherein the set of products generated from an ith sub-Chien search circuit is provided to the (i+1)th sub-Chien search circuit as a set of values.

40. The circuit as recited in claim 31, wherein the error locator polynomial includes L coefficients and wherein each of the N sub-Chien search circuits includes L storing elements.

41. The circuit as recited in claim 40, wherein each of the N sub-Chien search circuits share the L storage elements.

42. The circuit as recited in claim 40, wherein the multiplying means includes L constant multipliers.

43. The circuit as recited in claim 31, wherein the constant field elements are selected from the set of field elements.

44. The circuit as recited in claim 31, wherein the specified constant value is 1.

45. The circuit as recited in claim 31, wherein the constant field elements are inverse constant field elements.

* * * * *